(12) United States Patent
Hong et al.

(10) Patent No.: US 9,502,683 B2
(45) Date of Patent: Nov. 22, 2016

(54) SEALING PORTION STRUCTURE FOR DISPLAY DEVICE

(71) Applicant: SAMSUNG DISPLAY CO., LTD., Yongin, Gyeonggi-Do (KR)

(72) Inventors: Sang-Min Hong, Yongin (KR); Hyun-Min Hwang, Yongin (KR); Jae-Kyung Go, Yongin (KR); Su-Cheol Gong, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/549,970

(22) Filed: Nov. 21, 2014

(65) Prior Publication Data

US 2015/0372253 A1 Dec. 24, 2015

(30) Foreign Application Priority Data

Jun. 24, 2014 (KR) .................. 10-2014-0077493

(51) Int. Cl.
*H01L 51/52* (2006.01)
*H01L 27/32* (2006.01)

(52) U.S. Cl.
CPC ......... *H01L 51/5253* (2013.01); *H01L 51/524* (2013.01); *H01L 27/3244* (2013.01)

(58) Field of Classification Search
CPC ..................... H01L 51/5246; H01L 24/3276
See application file for complete search history.

(56) References Cited

U.S. PATENT DOCUMENTS

| 7,109,655 | B2* | 9/2006 | Kurihara | ............. | H01L 51/5237 313/504 |
| 7,531,847 | B2* | 5/2009 | Shitagaki | ............ | H01L 51/5237 257/100 |
| 7,679,693 | B2 | 3/2010 | Park | | |
| 8,049,412 | B2 | 11/2011 | Kwak | | |
| 8,164,257 | B2 | 4/2012 | Choi et al. | | |
| 2006/0113903 | A1 | 6/2006 | Kim | | |
| 2010/0072482 | A1* | 3/2010 | Eom | .................. | H01L 27/3276 257/72 |
| 2010/0207506 | A1* | 8/2010 | Kwon | ............. | G06K 19/07749 313/323 |
| 2011/0134056 | A1 | 6/2011 | Kim et al. | | |
| 2012/0043880 | A1 | 2/2012 | Lee | | |
| 2012/0248450 | A1* | 10/2012 | Yaneda | .................. | H01L 27/12 257/59 |
| 2012/0314148 | A1* | 12/2012 | Yamaguchi | ......... | H01L 51/5246 349/42 |
| 2013/0049003 | A1* | 2/2013 | Choi | .................. | H01L 51/5246 257/72 |
| 2013/0049062 | A1* | 2/2013 | Hatano | .................. | H01L 21/50 257/99 |
| 2013/0134401 | A1 | 5/2013 | Murakami et al. | | |

FOREIGN PATENT DOCUMENTS

| KR | 2005-0029019 A | 3/2005 |
| KR | 2006-0043040 A | 5/2006 |
| KR | 2006-0060179 A | 6/2006 |

(Continued)

*Primary Examiner* — Allen Parker
*Assistant Examiner* — Stephen Bradley
(74) *Attorney, Agent, or Firm* — Lee & Morse, P.C.

(57) ABSTRACT

A display device including a display substrate, the display substrate including an active area including a display unit that displays an image, a circuit area extending from the active area toward an exterior of the display device, and a cell seal area extending from the circuit area toward an exterior of the display device; an encapsulation substrate covering the display substrate; and a sealing portion between the display substrate and the encapsulation substrate, wherein the sealing portion includes a first sealing portion on the cell seal area, and a second sealing portion on the circuit area and extending from the first sealing portion.

17 Claims, 4 Drawing Sheets

(56) References Cited

FOREIGN PATENT DOCUMENTS

| KR | 10-0635514 B | 10/2006 |
| KR | 10-0897157 B | 5/2009 |
| KR | 2011-0051785 A | 5/2011 |
| KR | 2011-0062469 A | 6/2011 |
| KR | 2012-0017928 A | 2/2012 |
| KR | 2013-0007513 A | 1/2013 |

* cited by examiner

SEALING PORTION STRUCTURE FOR DISPLAY DEVICE

CROSS-REFERENCE TO RELATED APPLICATION

Korean Patent Application No. 10-2014-0077493, filed on Jun. 24, 2014, in the Korean Intellectual Property Office, and entitled: "Display Device," is incorporated by reference herein in its entirety.

BACKGROUND

1. Field

Embodiments relate to a display device.

2. Description of the Related Art

A display device, e.g., an organic light-emitting display device, may be used in mobile display devices such as smartphones, tablet personal computers (PCs), laptops, digital cameras, camcorders, and personal digital assistants (PDAs) or to electric/electronic products such as ultra-thin TVs.

SUMMARY

Embodiments are directed to a display device.

The embodiments may be realized by providing a display device including a display substrate, the display substrate including an active area including a display unit that displays an image, a circuit area extending from the active area toward an exterior of the display device, and a cell seal area extending from the circuit area toward an exterior of the display device; an encapsulation substrate covering the display substrate; and a sealing portion between the display substrate and the encapsulation substrate, wherein the sealing portion includes a first sealing portion on the cell seal area, and a second sealing portion on the circuit area and extending from the first sealing portion.

The circuit area may include a circuit wiring that is electrically connected to a device of the active area, and a power wiring that is electrically connected to the circuit wiring and that applies power from outside of the display substrate, and at least a part of the second sealing portion directly contacts the circuit wiring.

The display device may further include a protrusion portion, wherein the circuit wiring and the power wiring are disposed on different layers, at least a part of the circuit wiring overlies and is connected to the power wiring, and the protrusion portion overlies a part of an end of the circuit wiring that is connected to the power wiring.

The protrusion portion may cover a region where one end of the circuit wiring and the power wiring are connected and extends toward the encapsulation substrate.

The protrusion portion may overlie at least a part of the circuit wiring and at least a part of the power wiring.

At least a part of the protrusion portion may overlap with one end of the circuit wiring, and an outer surface of the protrusion portion may directly contact the second sealing portion.

At least a part of the second sealing portion may directly contact the power wiring.

The second sealing portion may include a first part that is on the power wiring, a second part that is on a region where the protrusion portion and the circuit wiring overlap, and a third part that is on the circuit wiring, and the first part, the second part, and the third part may be integrally formed.

The second sealing portion may be between the display substrate and the encapsulation substrate, and may bury the power wiring, the circuit wiring, and the protrusion portion.

The display unit may include a thin film transistor (TFT) that includes a semiconductor active layer, a gate electrode, a source electrode, and a drain electrode; and an organic light emitting diode (OLED) electrically connected to the TFT, the OLED including a first electrode, an intermediate layer, and a second electrode, the power wiring may be formed of a same material as that of the source electrode or the drain electrode, and the circuit wiring may be formed of a same material as that of the first electrode.

At least a part of the protrusion portion may overlap with one end of the circuit wiring, and a metal layer may directly contact an outer surface of the protrusion portion.

The metal layer may surround the outer surface of the protrusion portion.

The second sealing portion may directly contact an outer surface of the metal layer.

At least a part of the second sealing portion may directly contact the power wiring.

The second sealing portion may include a first part on the power wiring, a second part on a region where the protrusion portion and the circuit wiring overlap, and a third part formed on the circuit wiring, and the first part, the second part, and the third part may be integrally formed.

The second sealing portion may be between the display substrate and the encapsulation substrate, and may bury the power wiring, the circuit wiring, the protrusion portion, and the metal layer.

The display unit may include a TFT that includes a semiconductor active layer, at least one gate electrode, a source electrode, and a drain electrode; and an OLED electrically connected to the TFT, the OLED including a first electrode, an intermediate layer, and a second electrode, the power wiring may be formed of a same material as that of the source electrode or the drain electrode, the circuit wiring may be formed of a same material as that of the first electrode, and the metal layer may be formed of a same material as that of the second electrode.

The display device may further include a pixel defining layer that defines each of the pixels of the display unit, wherein the protrusion portion is formed of a same material as that of the pixel defining layer.

The first sealing portion and the second sealing portion may be integrally formed.

The display device may further include a reinforcing member on an outer side of the first sealing portion.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
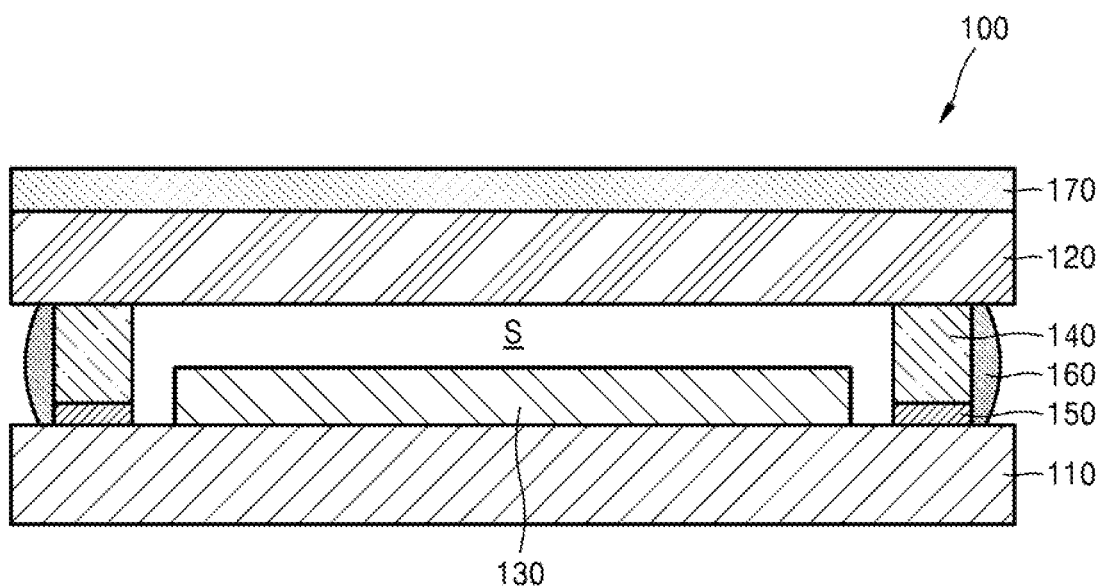
FIG. 1 illustrates a schematic view of a display device according to an embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "includes", "including", "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. For example, intervening layers, regions, or components may be present.

FIG. 1 illustrates a schematic view of a display device according to an embodiment.

In the present embodiment, the display device 100 is an organic light emitting display device (OLED). However, the display device 100 is not limited thereto and may be one of display devices that form images with applied power, e.g., a liquid crystal display device (LCD), a field emission display device (FED), and an electronic paper display device (EPD).

Referring to FIG. 1, the display device 100 may include a display substrate 110 and an encapsulation substrate 120 on the display substrate 110.

The display substrate 110 may be, e.g., a glass substrate having rigidity, a polymer substrate, a film having flexibility, a metal substrate, or a combination thereof. The encapsulation substrate 120 may be, e.g., a glass substrate, a resin substrate, a film having flexibility, or a thin film in which an organic layer and an inorganic layer are alternately stacked. A display unit 130 (that displays an image) may be on the display substrate 110.

A sealing portion 140 may be on a surface on which the display substrate 110 and the encapsulation substrate 120 face each other. For example, the sealing portion 140 may be between the display substrate 110 and the encapsulation substrate 120. The sealing portion 140 may be formed along the edges of the display substrate 110 and the encapsulation substrate 120. A metal pattern layer 150 may be between the display substrate 110 and the sealing portion 140.

The sealing portion 140 may be formed of or may include a material that is meltable by a laser. For example, the sealing portion 140 may include a glass frit. In an implementation, the sealing portion 140 may include a suitable material that is meltable and/or curable by applying predetermined heat energy. The metal pattern layer 150 may absorb heat of the laser or reflect the laser to transfer heat to the sealing portion 140.

A reinforcing member 160 may be on an outer side of the sealing portion 140. For example, the reinforcing member 160 may be on a side of the sealing portion 140 that is opposite to a side of the sealing portion 140 that faces the display unit 130. The reinforcing member 160 may supplement an adhesion intensity of the sealing portion 140 and may be formed of or may include an adhesive material. In an implementation, the reinforcing member 160 may be formed of or may include, e.g., an organic sealant such as urethane based resin, epoxy based resin, or acrylic based resin, or an inorganic sealant such as silicon.

A moisture absorbent or a filler may be provided in an inner space S that is sealed by the display substrate 110, the encapsulation substrate 120, and the sealing portion 140.

A functional layer 170 having various functions may be formed on the encapsulation substrate 120. For example, the functional layer 170 may include at least one of a polarization plate, a touch screen, or a cover window.

For example, an on-cell touch screen panel (TSP) may be manufactured by directly forming a touch screen pattern on the encapsulation substrate 120. The polarization plate may help prevent external light from being reflected from the display unit 130. The cover window may help protect the display device 100.

In the display device 100 reducing the size a dead space (e.g., an area that is not related to an area that forms an image) may be desirable. For example, in the display device 100 a width of a cell seal area in which the sealing portion 140 is formed may be reduced and/or a margin of a cutting area that may be separated as a separate display device may be reduced.

However, if the width of the sealing portion 140 is reduced, adhesion between the display substrate 110 and the encapsulation substrate 120 may deteriorate.

In an embodiment, the sealing portion 140 may extend from a cell seal area to a circuit area in which a circuit wiring is disposed while reducing the dead space, in order to help increase adhesion between the display substrate 110 and the encapsulation substrate 120.

Figure 2:
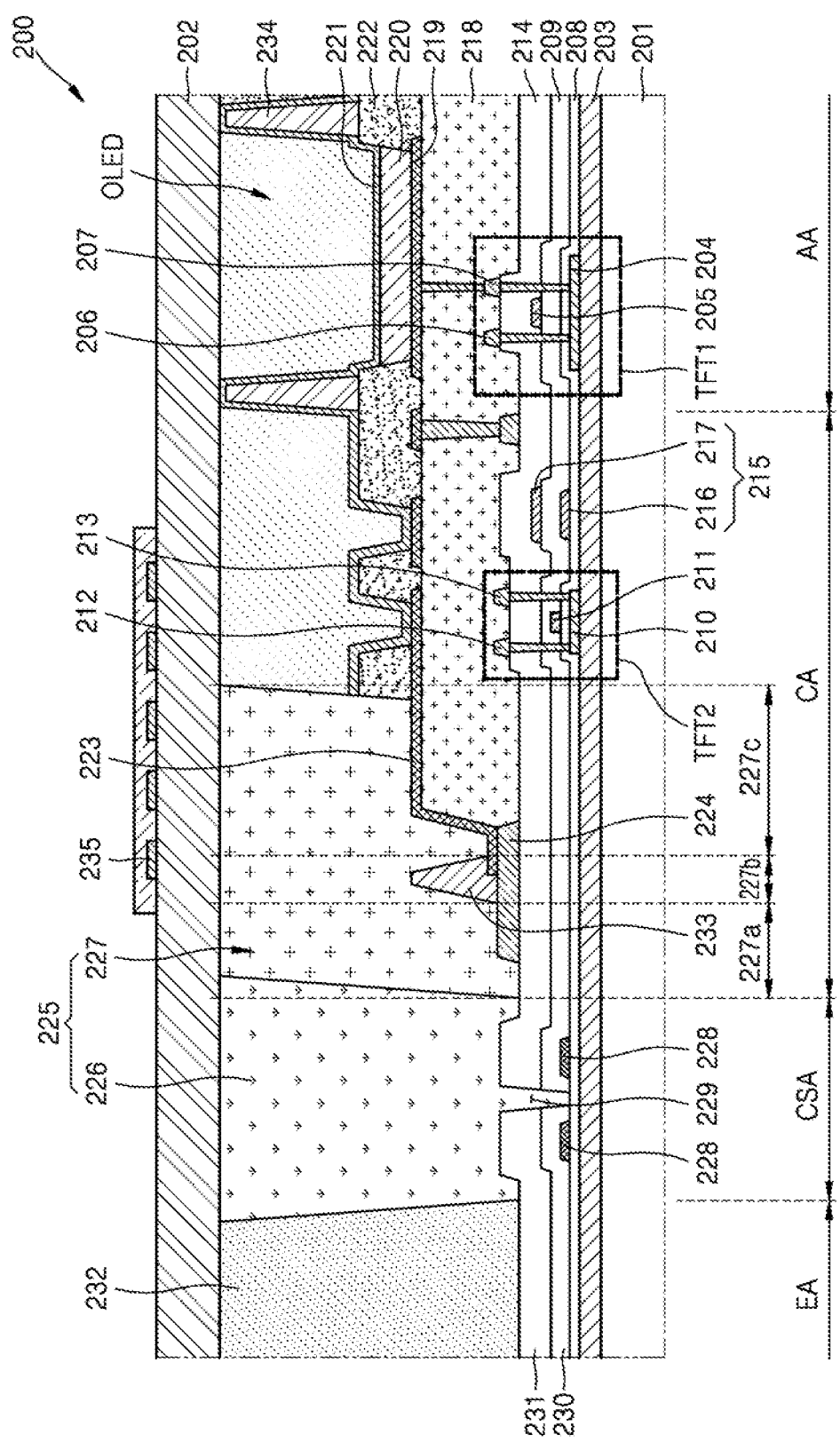
FIG. 2 illustrates an enlarged cross-sectional view of a part of a display device according to an embodiment.

FIG. 2 illustrates an enlarged cross-sectional view of a part of a display device according to an embodiment.

Referring to FIG. 2, the display device 200 may include a display substrate 201 and an encapsulation substrate 202 on the display substrate 201.

The display substrate 201 may include an active area AA, a circuit area CA (extending from the outside of or away from the active area AA), and a cell seal area CSA (extending from the outside of or away from the circuit area CA).

The active area AA may include an area that forms an image. The circuit area CA may include an area in which a circuit pattern for electrically transmitting a signal to device of the display active area AA is formed. The cell seal area CSA may include an area that seals the display substrate 201 and the encapsulation substrate 202.

The display substrate 201 may be, e.g., a glass substrate, a polymer substrate, a flexible film, a metal substrate, or a combination thereof. The display substrate 201 may be transparent, opaque, or semi-transparent.

A barrier layer 203 may be formed on the display substrate 201. The barrier layer 203 may provide a flat surface to the display substrate 201 and may help prevent moisture or external elements from permeating into the display substrate 201. The barrier layer 203 may have a structure in which inorganic layers such as silicon oxide, organic layers such as polyimide, or an organic layer and an inorganic layer are alternately stacked.

A thin film transistor (TFT) may be formed in the active area AA and a TFT may be formed in the circuit area CA. In an implementation, a plurality of TFTs may be provided on different layers. In an implementation, the plurality of TFTs may be disposed in the active area AA and the circuit area CA and is described as an example.

A first TFT1 (in the active area AA) may include a first semiconductor active layer 204, a first gate electrode 205, a first source electrode 206, and a first drain electrode 207. A first gate insulating layer 208 and a second gate insulating layer 209 may be between the first semiconductor active layer 204 and the first gate electrode 205 so as to insulate the first semiconductor active layer 204 and the first gate electrode 205 from each other.

A second TFT2 (n the circuit area CA) may include a second semiconductor active layer 210, a second gate electrode 211, a second source electrode 212, and a second drain electrode 213. The first gate insulating layer 208 may be between the second semiconductor active layer 210 and the second source electrode 212 so as to insulate the second semiconductor active layer 210 and the second source electrode 212 from each other.

When the first TFT1 and the second TFT2 are compared to each other, the first TFT1 may further include the second gate insulating layer 209 between the first semiconductor active layer 204 and the first gate electrode 205. For example, the first TFT1 may include a gate insulating layer that is thicker than that of the second TFT2. When a thick gate insulating layer is provided, a driving range of a gate voltage applied to a gate electrode may be increased.

The first TFT1 may be a driving TFT for driving an OLED. An increase in the driving range of the driving TFT may be that the driving TFT may be controlled to allow the OLED to emit light having a more abundant gradation.

The first gate electrode 205 and the second gate electrode 211 may not be formed on a same layer. Thus, the first TFT1 and the second TFT2 may be adjacent to each other, no interference may occur, and more devices may be disposed in a same area.

The first semiconductor active layer 204 and the second semiconductor active layer 210 may be formed on the barrier layer 203. The first semiconductor active layer 204 and the second semiconductor active layer 210 may include, e.g., an inorganic semiconductor such as amorphous silicon or poly silicon or an organic semiconductor.

In an implementation, the first semiconductor active layer 204 and the second semiconductor active layer 210 may be formed of or may include, e.g., an oxide semiconductor. For example, the oxide semiconductor may include an oxide of a material selected from the group of Group 4, 12, 13, and 14 metal elements, such as zinc (Zn), indium (In), gallium (Ga), tin (Sn), cadmium (Cd), germanium (Ge), and hafnium (Hf), and a combination thereof.

The first gate insulating layer 208 may be formed on the barrier layer 203 and may cover the first semiconductor active layer 204 and the second semiconductor active layer 210.

The second gate electrode 211 may be formed on the first gate insulating layer 208 and may overlap with a part of the second semiconductor active layer 210.

The second gate insulating layer 209 may cover the second gate electrode 211.

The first gate electrode 205 may be formed on the second gate insulating layer 209 and may overlap with a part of the first semiconductor active layer 204.

The first gate electrode 205 and the second gate electrode 211 may include a single layer or a layer stack including, e.g., gold (Au), silver (Ag), copper (Cu), nickel (Ni), platinum (Pt), palladium (Pd), aluminum (Al), molybdenum (Mo), chromium (Cr), or the like, or may include an alloy such as Al:Nd, Mo:W, or the like.

The first gate insulating layer 208 and the second gate insulating layer 209 may include an inorganic layer, e.g., silicon oxide, silicon nitride, or metal oxide. The first gate insulating layer 208 and the second gate insulating layer 209 may have a single layer or multilayer structure.

An interlayer insulating layer 214 may cover the first gate electrode 205. The interlayer insulating layer 214 may be formed as or may include an inorganic layer such as silicon oxide or silicon nitride. In an implementation, the interlayer insulating layer 214 may be formed as or may include an organic layer.

The first source electrode 206 and the first drain electrode 207 may be formed on the interlayer insulating layer 214 and may contact the first semiconductor active layer 204 via a contact hole. The second source electrode 212 and the second drain electrode 213 may be formed on the interlayer insulating layer 214 and may contact the second semiconductor active layer 210 via a contact hole. The first source electrode 206, the second source electrode 212, the first drain electrode 207, and the second drain electrode 213 may include, e.g., metal, alloys, metal nitride, conductive metal oxide, transparent conductive materials, or the like.

The structure of the TFT described above is not necessarily limited thereto. A variety of structures of the TFT may be applied. For example, although the TFT is described and illustrated as a top gate structure, the TFT may be formed as a bottom gate structure in which the first gate structure 205 is in a lower portion of the first semiconductor active layer 204.

A capacitor 215 may be formed in the circuit area CA. In an implementation, the capacitor 215 may also be formed in the active area AA.

The capacitor 215 may include a first capacitor electrode 216, a second capacitor electrode 217, and a second gate insulating layer 209 between the first capacitor electrode 216 and the second capacitor electrode 217. The first capacitor electrode 216 may be formed of a same material as that of the second gate electrode 211. The second capacitor electrode 217 may be formed of a same material as that of the first gate electrode 205.

A planarization layer 218 may cover the first and second TFTs, TFT1 and TFT2, and the capacitor 215. The planarization layer 218 may be formed on the interlayer insulating layer 214. The planarization layer 218 may remove a step difference between thin films and may planarize the thin films so as to increase emission efficiency of the OLED to be formed thereon.

The planarization layer 218 may be formed of an insulator. For example, the planarization layer 218 may be formed as a single layer or a multilayer stack including an inorganic material, an organic material, or an organic/inorganic compound, and may be formed by using various deposition methods.

In an implementation, the planarization layer 218 may be formed of an organic material, e.g., a polyacrylate resin, an epoxy resin, benzocyclobutene (BCB), or the like, or an inorganic material, e.g., SiNx.

In an implementation, one of the planarization layer 218 and the interlayer insulating layer 214 may be omitted.

The OLED may be formed on the planarization layer 218. The OLED may include a first electrode 219, an intermediate layer 220 (including an emissive layer), and a second electrode 221.

A pixel defining layer (PDL) 222 may cover the planarization layer 218 and parts of the first electrode 219, and may define a pixel area and a non-pixel area. The PDL 222 may be formed of an organic material or an inorganic material. For example, the PDL 222 may be formed of an organic material, such as polyimide, polyamide, BCB, acrylic resin, phenol resin, or the like, or an inorganic material, such as SiNx. The PDL 222 may be formed as a single layer or a layer stack.

Holes and electrons that are injected from the first electrode 219 and the second electrode 221 of the OLED may be combined in the emissive layer of the intermediate layer 220 to generate light.

The intermediate layer 220 may include the emissive layer. In an implementation, the intermediate layer 220 may include the emissive layer and at least one of a hole injection layer (HIL), a hole transport layer (HTL), an electron transport layer (ETL), and an electron injection layer (EIL). In an implementation, the intermediate layer 220 includes the emission layer and may further include other various functional layers.

The second electrode 221 may be formed on the intermediate layer 220. The second electrode 221 and the first electrode 219 may form an electric field to allow light to be emitted from the intermediate layer 220. The first electrode 219 may be patterned for each pixel. The second electrode 221 may apply a common voltage to all pixels.

The first electrode 219 and the second electrode 221 may include a transparent electrode or a reflective electrode.

The first electrode 219 may function as an anode and may be formed of various conductive materials. In an implementation, the first electrode 219 may be a transparent electrode and/or the first electrode 219 may be formed as a reflective electrode.

For example, when the first electrode 219 is the transparent electrode, the first electrode 219 may be formed of or may include indium tin oxide (ITO), indium zinc oxide (IZO), zinc oxide (ZnO), or indium oxide ($In_2O_3$). When the first electrode 219 is the reflective electrode, the first electrode 219 may be formed by forming a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof, and depositing ITO, IZO, ZnO, or $In_2O_3$ on the reflective layer.

The second electrode 221 may function as a cathode. The second electrode 221 may be formed as a transparent electrode or a reflective electrode, like the first electrode 219.

For example, when the second electrode 221 is a transparent electrode, the second electrode 221 may be formed by depositing a metal having a low work function such as lithium (Li), calcium (Ca), lithium fluoride/calcium (LiF/Ca), lithium fluoride/aluminum (LiF/Al), aluminum (Al), magnesium (Mg), or a compound thereof, on the intermediate layer 220 and further forming an auxiliary electrode formed of a transparent electrode material, such as ITO, IZO, ZnO, $In_2O_3$, or the like on the metal and the compound. When the second electrode 221 is the reflective electrode, the second electrode 221 may be formed of Li, Ca, LiF/Ca, LiF/Al, Al, Mg, a compound thereof.

In an implementation, the first electrode 219 may function as the anode, and the second electrode 221 may function as the cathode. In an implementation, the first electrode 219 may function as the cathode, and the second electrode 221 may function as the anode.

In an implementation, each of the OLEDs may form one pixel. Each of pixels may form red, green, blue, or white colors. In an implementation, the intermediate layer 220 may be commonly formed in the entire first electrode 219, e.g., irrespective of locations of the pixels. In this regard, the emissive layer may be formed by vertically stacking layers including emissive materials that emit red, green, and blue light, or mixing the emissive materials that emit red, green, and blue light. Any suitable combination of other various colors, which is capable of emitting a white light, may be employed. In an implementation, a color conversion layer (that converts the emitted white light into a predetermined color or a color filter) may be further employed.

A protection layer (not shown) may be provided on the second electrode 221. The protection layer may cover the OLED. The protection layer (not shown) may use or may include an inorganic insulating layer and/or an organic insulating layer.

A spacer 234 may be provided in the non-pixel area. The spacer 234 may be between the display substrate 201 and the encapsulation substrate 202. The spacer 234 may help maintain a space between the display substrate 201 and the encapsulation substrate 202. The spacer 234 may be installed such that a display characteristic may not deteriorate due to an external shock.

The spacer 234 may be formed on the PDL 222. The spacer 234 may protrude or extend toward the encapsulation substrate 202 from the PDL 222. In an implementation, the PDL 222 and the spacer 234 may be integrally formed by using a photoconductive material via photography or photography etching. For example, a half-tone mask may be used to adjust an exposure amount via an exposure process and simultaneously form the PDL 222 and the spacer 234.

The second electrode 221 and/or the protection layer (not shown) may be provided on the spacer 234.

Various circuit patterns may be formed on the circuit area CA. For example, a power supply pattern, an antistatic pattern, and/or other circuit patterns may be formed.

In an implementation, a circuit wiring 223 may be formed in the circuit area CA. The circuit wiring 223 may be formed on the planarization layer 218. The circuit wiring 223 may be formed of a same material as that of the first electrode 219. The circuit wiring 223 may be electrically connected to the second electrode 221 of the OLED.

The circuit wiring 223 may be connected to a power wiring 224. The power wiring 224 may be formed on the interlayer insulating layer 214. The power wiring 224 may be formed of a same material as that of the first source electrode 206, the second source electrode 212, the first drain electrode 207, and the second drain electrode 213. The power wiring 224 may be supplied by power from outside of the display device 200.

The encapsulation substrate 202 may be coupled onto the display substrate 201. The encapsulation substrate 202 may help protect the OLED and other thin films from external moisture or oxygen.

The encapsulation substrate 202 may be, e.g., a glass substrate having rigidity, a polymer substrate, or a flexible film. In an implementation, the encapsulation substrate 202 may have a structure in which an organic layer and an inorganic layer are alternately stacked.

In an implementation, a plurality of touch electrodes 235 (that function as a touch screen) may be formed on the encapsulation substrate 202. In an implementation, a functional layer, e.g., a polarization film, a color filter, or a cover window, may be further formed on the encapsulation substrate 202.

A sealing portion 225 may be provided between the display substrate 201 and the encapsulation substrate 202. The sealing portion 225 may include a first sealing portion 226 on the cell seal area CSA and a second sealing portion 227 on the circuit area CA and extending, e.g., inwardly, from the first sealing portion 226. The first sealing portion 226 and the second sealing portion 227 may be integrally formed.

The first sealing portion 226 may be formed on or in the cell seal area CSA. In an implementation, the first sealing portion 226 may be provided along a circumference of the circuit area CA.

A metal pattern layer 228 may be formed in a lower portion of, e.g., below or under, the first sealing portion 226. The metal pattern layer 228 may transfer heat to the first sealing portion 226 by absorbing heat of laser or by reflecting the laser.

The metal pattern layer 228 may be formed on a same layer as (e.g., directly on the first gate insulating layer 208) and may be formed of a same material as that of the second gate electrode 211 of the second TFT (TFT2). In an implementation, the metal pattern layer 228 may be formed on a same layer as (e.g., directly on the second gate insulating layer 209) and may formed of a same material as that of the first gate electrode 205 of the first TFT (TFT1).

The metal pattern layer 228 may be a single layer or a layer stack including, e.g., gold (Au), silver (Ag), copper (Cu), nickel (Ni), platinum (Pt), palladium (Pd), aluminum (Al), molybdenum (Mo), chromium (Cr), or the like, or may include an alloy such as Al:Nd, Mo:W, or the like.

At least one insulating layer, e.g., a first insulating layer 230 and a second insulating layer 231, may be formed on the metal pattern layer 228. When the first insulating layer 230 and the second insulating layer 231 are formed on the metal pattern layer 228, the metal pattern layer 228 may help prevent occurrence of a hillock phenomenon and/or a bubble (which may be caused due to a rapid rise of temperature of laser). The first insulating layer 230 may be formed of the same material as and may be on a same layer as that of the second gate insulating layer 209. The second insulating layer 231 may be formed of a same material as and may be on a same layer as that of the interlayer insulating layer 214.

The first insulating layer 230 and the second insulating layer 231 may include an opening 229. The opening 229 may increase a contact area between the first sealing portion 226 and the first insulating layer 230 and the second insulating layer 231. Accordingly, bonding intensity of the first sealing portion 226 and the first insulating layer 230 and the second insulating layer 231 may be improved.

The second sealing portion 227 may be formed in the circuit area CA. At least a part of the second sealing portion 227 may directly contact the circuit wiring 223.

In an implementation, the circuit wiring 223 and the power wiring 224 may be provided on different layers. For example, the circuit wiring 223 may be formed on the planarization layer 218. The circuit wiring 223 may be formed of a same material as that of the first electrode 219 during a same process. The power wiring 224 may be formed on the interlayer insulating layer 214. The power wiring 224 may be formed of a same material as that of the first source electrode 206, the second source electrode 212, the first drain electrode 207, and the second drain electrode 213 during a same process.

At least a part of the circuit wiring 223 may overlap with the power wiring 224. For example, one end of the circuit wiring 223 may contact the power wiring 224. A protrusion portion 233 is formed on a part where one end of the circuit wiring 223 and the power wiring 224 are connected.

The protrusion portion 233 may protrude from a part or region at which the circuit wiring 223 and the power wiring 224 are connected and may extend toward the encapsulation substrate 202. For example, the protrusion portion 233 may extend over or cover at least a part of the circuit wiring 223 and at least a part of the power wiring 224. The protrusion portion 233 may be formed of a same material as that of the PDL 222 during a same process.

The protrusion portion 233 may overlap with one end of the circuit wiring 223 to function as a clad layer. The protrusion portion 223 may support one end of the circuit wiring 223, thereby helping to reduce the likelihood of and/or to help prevent the circuit wiring 223 from curling. The protrusion 223 may help prevent an electrical short between adjacent wiring when the circuit wiring 223 is etched, and help reduce a driving defect due to curling from an edge of the circuit wiring 223.

The second sealing portion 227 may directly contact an outer surface of the protrusion portion 233. The protrusion portion 233 may cover or contact the second sealing portion 227 or the power wiring 224. In an implementation, at least a part of the second sealing portion 227 may directly contact the power wiring 224.

In an implementation, the second sealing portion 227 may include a first part 227a formed on or overlying the power wiring 224, a second part 227b formed on or overlying the protrusion portion 233 or a part in which the protrusion portion 233 and at least a part of the circuit wiring 223 overlap with each other, and a third part 227c formed on or overlying the circuit wiring 223. The first part 227a, the second part 227b, and the third part 227c may be integrally formed.

As described above, the second sealing portion 227 may be between the display substrate 201 and the encapsulation substrate 202, and may bury, cover, or surround the circuit wiring 223, the power wiring 224, and the protrusion portion 233.

The sealing portion 225 (including the first sealing portion 226 and the second sealing portion 227) may include, e.g., a glass frit. The glass frit may include, e.g., glass powder and oxide powder. A gel paste may be produced by adding an organic material to the glass frit including the oxide powder, and may be cured at a range of temperature, e.g., from about 300° C. to about 500° C. If the glass fit is cured, the organic material may be extinguished or burned off into the atmosphere, and the gel paste may be hardened, and thus a solid frit may be present.

In the meantime, an edge area EA (including a cut area) may be formed at an outside of the cell seal area CSA. A reinforcing member 232 may be formed in the edge area EA. The reinforcing member 232 may supplement an adhesion intensity of the first sealing portion 226, and may be formed of, e.g., an adhesive material.

The reinforcing member 232 may be formed of or may include, e.g., an organic sealant such as urethane based resin, epoxy based resin, or acrylic based resin, or inorganic sealant such as silicon. Urethane acrylate, or the like, may be used as the urethane based resin. In an implementation, the reinforcing member 232 may be formed of a material that is hardened by heat.

In an implementation, the reinforcing member 232 may contact the first sealing portion 226 or may be spaced apart from the first sealing portion 226 by a predetermined gap.

As described above, the second sealing portion 227 may integrally extend from the first sealing portion 226 (formed in the cell seal area CSA) to the circuit area CA (on which the circuit pattern 223 is formed). Thus, the display device 100 may have an improved adhesive force between the display substrate 201 and the encapsulation substrate 202 while reducing the edge area EA and the cell seal area CSA corresponding to a dead space and the cut area.

The first part 227a of the second sealing portion 227 may directly contact the power wiring 224 (having a triple layer structure of a conductive material, e.g., titanium (Ti)/aluminum (Al)/titanium (Ti)). The second part 227b of the second sealing portion 227 may contact an outer surface of the protrusion portion 233 (formed of an insulating material, e.g., polyimide). The third part 227c of the second sealing portion 227 may directly contact the circuit wiring 223 (having a triple layer structure of a conductive material, for example, ITO/Ag/ITO).

As described above, the second sealing portion 227 may have a different structure for each area, thereby improving an adhesive force of the circuit area CA without damage of a circuit pattern layer by applying and curing a predetermined heat energy such as a laser beam to the sealing portion 225.

At least one part of the protrusion portion 233 may be formed as a clad layer in or on an end portion of the circuit wiring 223, thereby helping to reduce the likelihood of and/or prevent the circuit wiring 223 (formed by etching) from being shorted.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Figure 3:
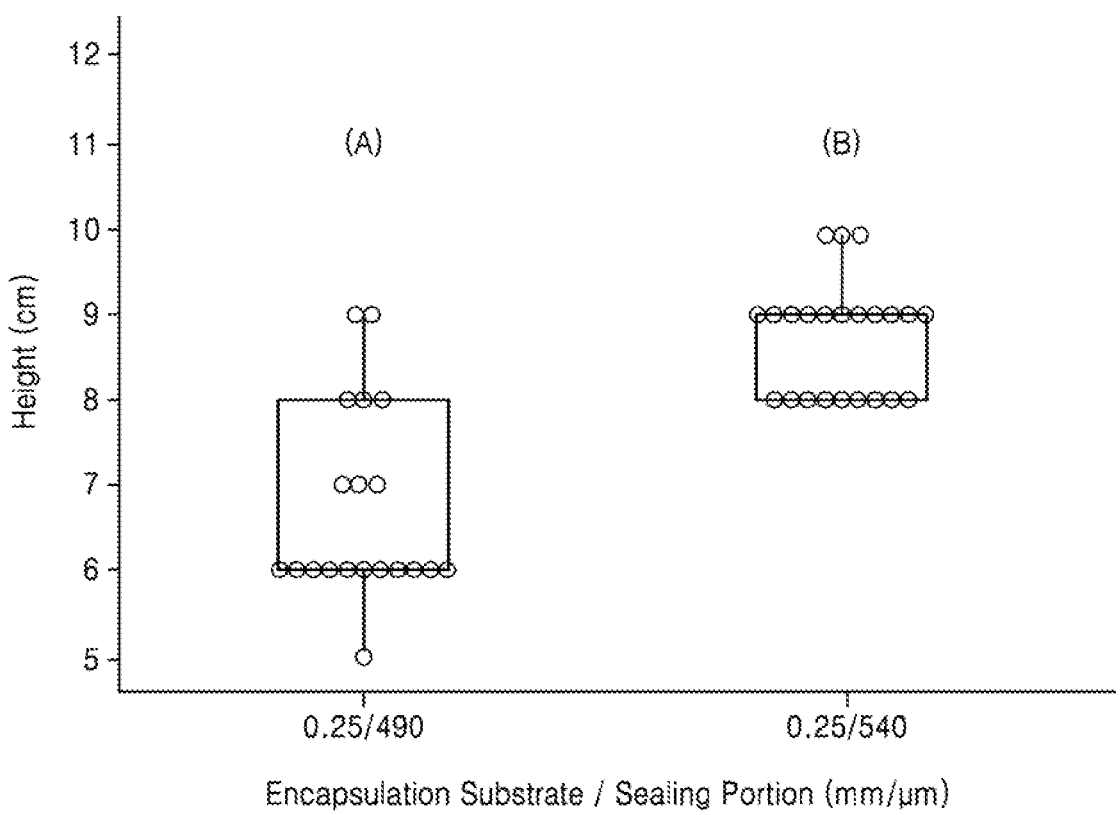
FIG. 3 illustrates a graph of a result of a falling dart impact strength test with respect to a sealing portion according to a Comparative Example and an Example.

FIG. 3 illustrates a graph of a result of a falling dart impact strength test with respect to a sealing portion according to a Comparative Example and an Example. Table 1, below, shows values of the falling dart impact strength of FIG. 3.

TABLE 1

|  | Comparative Example (A) | Example (B) |
|---|---|---|
| Display substrate/ Encapsulation substrate | 0.25/0.25 | 0.25/0.25 |
| Width of sealing portion (μm) | 490 | 540 |
| Minimum height (cm) | 5 | 8 |
| Maximum height (cm) | 9 | 10 |
| Average height (cm) | 6.8 | 8.8 |

In this regard, in the Comparative Example (A), the sealing portion was formed only in a conventional cell seal area CSA, and in the Example (B), the sealing portion 225 was formed in the cell seal area CSA and the circuit area CA. A falling dart impact strength test determines a damage state of a panel when a dart formed of a urethane ball and 200 grams (g) falls onto the panel at different heights.

Referring to FIG. 3 and Table 1, in the Comparative Example (A), thicknesses of the display substrate and the encapsulation substrate were 0.25 millimeters (mm), and a width of the sealing portion (formed only in the cell seal area CSA) was 490 micrometers (μm). In this regard, a minimum falling height was 5 centimeters (cm), a maximum falling height was 9 centimeters (cm), and an average falling height was 6.8 centimeters (cm).

In the Example (B), thicknesses of the display substrate 201 and the encapsulation substrate 202 were 0.25 millimeters (mm), and a width of the sealing portion 225 (formed in the cell seal area CSA and the circuit area CA) was 540 micrometers (m). In this regard, a minimum falling height was 8 centimeters (cm), a maximum falling height was 10 centimeters (cm), and an average falling height was 8.8 centimeters (cm).

As may be seen above, a falling dart strength in the Example (B) was improved by 35%, compared to that of the Comparative Example (A).

Figure 4:
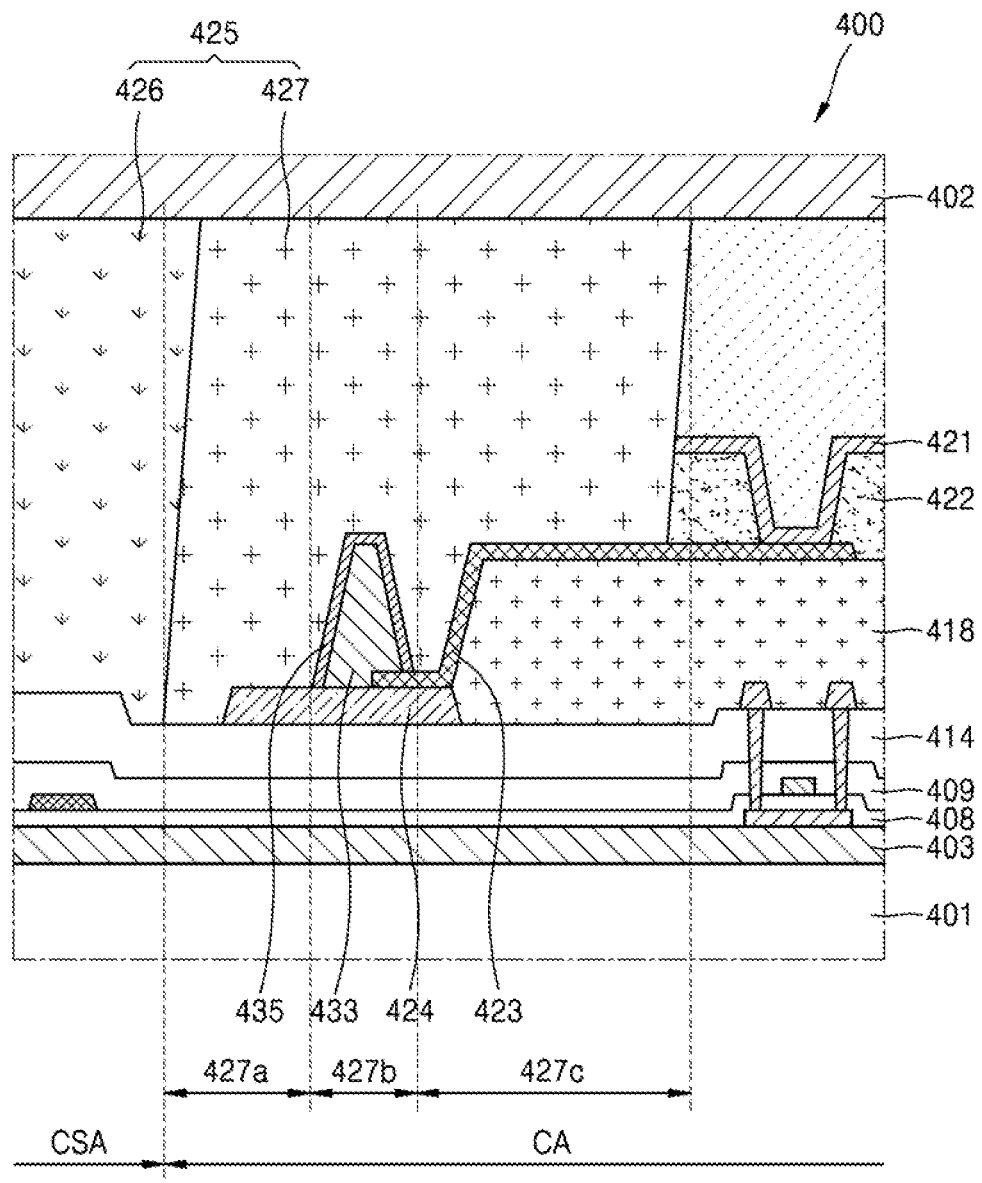
FIG. 4 illustrates a cross-sectional view of a display device according to another embodiment.

FIG. 4 illustrates a cross-sectional view of a display device 400 according to another embodiment.

The same terms between FIGS. 2 and 4 are same members having same functions, and thus redundant descriptions may be minimized, and a characterizing portion of the present embodiment will now be described.

Referring to FIG. 4, a barrier layer 403 may be formed on a display substrate 401. A first gate insulating layer 408, a second gate insulating layer 409, and an interlayer insulating layer 414 (for insulating devices included in a TFT from each other) may be stacked on the barrier layer 403. A planarization layer 418 may be formed on the interlayer insulating layer 414. A PDL 422 (that defines a pixel area) may be formed on the planarization layer 418.

A sealing portion 425 may be provided between a display substrate 401 and an encapsulation substrate 402. The sealing portion 425 may include a first sealing portion 426 (on the cell seal area CSA), and a second sealing portion 427 (on the circuit area CA and extending from the first sealing portion 426). The first sealing portion 426 and the second sealing portion 427 may be integrally formed.

At least a part of the second sealing portion 427 may directly contact the circuit wiring 423.

In an implementation, the circuit wiring 423 and the power wiring 424 may be on different layers. The circuit wiring 423 may be formed on the planarization layer 418, and the power wiring 424 may be formed on the interlayer insulating layer 414.

At least a part of the circuit wiring 423 may overlap with the power wiring 424. For example, one end of the circuit wiring 423 may contact the power wiring 424. A protrusion portion 433 may be formed on or may overlie a part of one end of the circuit wiring 423 to which the power wiring 424 is connected.

The protrusion portion 433 may protrude or extend from a part or region on which the circuit wiring 423 and the power wring 424 are connected and toward the encapsulation substrate 402. The protrusion portion 433 may extend over, may cover, or may overlie at least a part of the circuit wiring 423 and at least a part of the power wiring 424.

At least a part of the protrusion portion 433 may overlap with or overlie one end of the circuit wiring 423. A metal layer 435 may be formed on the protrusion portion 433. The metal layer 435 may directly contact an outer surface of the protrusion portion 433. In an implementation, the metal layer 435 may surround the outer surface of the protrusion portion 433. The metal layer 435 may be formed of a same material as that of the second electrode 421 of the OLED during a same process.

The second sealing portion 427 may directly contact an outer surface of the metal layer 435. The metal layer 435 may cover or may be covered by the second sealing portion 427. At least a part of the second sealing portion 427 may directly contact the power wiring 424.

The metal layer 435 may be provided as follows.

The second sealing portion 427 may include a glass fit. The protrusion portion 433 may be formed of polymer resin, e.g., polyimide. The second sealing portion 427 may have an excellent adhesion force with metals. However, an adhesive force between the second sealing portion 427 and polymer resin may not be as suitable as that between the second sealing portion 427 and metals. Thus, the metal layer 435 may be additionally formed between the second sealing portion 427 and the protrusion portion 433, thereby increasing the adhesive force. In an implementation, outgassing that may occur in the protrusion portion 433 may be reduced.

The second sealing portion 427 may include a first part 427a (on the power wiring 424), a second part 427b (on a part in which the metal layer 435, the protrusion portion 433, and at least a part of the circuit wiring 423 overlap with each other), and a third part 427c (on the circuit wiring 424). The first part 427a, the second part 427b, and the third part 427c may be integrally formed.

For example, the second sealing portion 427 may be between the display substrate 401 and the encapsulation substrate 402, and may bury, cover, or surround the power wiring 424, the circuit wiring 423, the protrusion portion 433, and the metal layer 435.

As described above, the second sealing portion 427 may extend from the first sealing portion 426 (in the cell seal area CSA) to or into the circuit area CA, on which a circuit pattern is formed, thereby improving an adhesive force between the display substrate 401 and the encapsulation substrate 402, while also reducing a dead space.

The metal layer 435 may be between the second sealing portion 427 and the protrusion portion 433, thereby additionally improving the adhesion force.

By way of summation and review, a display device may include sealed substrates in order to protect a display unit that forms an image. A sealing portion may be formed between upper and lower substrates, energy may be applied to the sealing portion, and thus the upper and lower substrates are bonded to each other. During sealing, a structural strength of the sealing portion may be maintained.

As described above, according to an embodiment, a display device may exhibit improved adhesion intensity between a substrate and an encapsulation substrate in a circuit pattern area.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a display substrate, the display substrate including:
an active area including a display unit that displays an image,
a circuit area extending from the active area toward an exterior of the display device, and
a cell seal area extending from the circuit area toward an exterior of the display device;
a protrusion portion;
an encapsulation substrate covering the display substrate; and
a sealing portion between the display substrate and the encapsulation substrate, wherein the sealing portion includes:
a first sealing portion on the cell seal area, and
a second sealing portion on the circuit area and extending from the first sealing portion,
wherein the circuit area includes:
a circuit wiring that is electrically connected to a device of the active area, and
a power wiring that is electrically connected to the circuit wiring and that applies power from outside of the display substrate, and
wherein at least a part of the second sealing portion directly contacts the power wiring, and
wherein:
the circuit wiring and the power wiring are disposed on different layers,
at least a part of the circuit wiring overlies and is connected to the power wiring, and
the protrusion portion overlies a part of an end of the circuit wiring that is connected to the power wiring.

2. The display device as claimed in claim 1, wherein:
at least a part of the second sealing portion directly contacts the circuit wiring.

3. The display device as claimed in claim 1, wherein the protrusion portion covers a region where one end of the circuit wiring and the power wiring are connected and extends toward the encapsulation substrate.

4. The display device as claimed in claim 3, wherein the protrusion portion overlies at least a part of the circuit wiring and at least a part of the power wiring.

5. The display device as claimed in claim 1, wherein:
at least a part of the protrusion portion overlaps with one end of the circuit wiring, and
an outer surface of the protrusion portion directly contacts the second sealing portion.

6. The display device as claimed in claim 5, wherein:
the second sealing portion includes:
a first part that is on the power wiring,
a second part that is on a region where the protrusion portion and the circuit wiring overlap, and
a third part that is on the circuit wiring, and
the first part, the second part, and the third part are integrally formed.

7. The display device as claimed in claim 6, wherein the second sealing portion:
is between the display substrate and the encapsulation substrate, and
buries the power wiring, the circuit wiring, and the protrusion portion.

8. The display device as claimed in claim 5, wherein:
the display unit includes:
a thin film transistor (TFT) that includes a semiconductor active layer, a gate electrode, a source electrode, and a drain electrode; and
an organic light emitting diode (OLED) electrically connected to the TFT, the OLED including a first electrode, an intermediate layer, and a second electrode,
the power wiring is formed of a same material as that of the source electrode or the drain electrode, and the circuit wiring is formed of a same material as that of the first electrode.

9. The display device as claimed in claim 1, wherein: a metal layer directly contacts an outer surface of the protrusion portion.

10. The display device as claimed in claim 9, wherein the metal layer surrounds the outer surface of the protrusion portion.

11. The display device as claimed in claim 9, wherein the second sealing portion directly contacts an outer surface of the metal layer.

12. The display device as claimed in claim 11, wherein: the second sealing portion includes:
 a first part on the power wiring,
 a second part on a region where the protrusion portion and the circuit wiring overlap, and
 a third part formed on the circuit wiring, and
the first part, the second part, and the third part are integrally formed.

13. The display device as claimed in claim 12, wherein the second sealing portion:
 is between the display substrate and the encapsulation substrate, and
 buries the power wiring, the circuit wiring, the protrusion portion, and the metal layer.

14. The display device as claimed in claim 11, wherein: the display unit includes:
 a TFT that includes a semiconductor active layer, a gate electrode, a source electrode, and a drain electrode; and
 an OLED electrically connected to the TFT, the OLED including a first electrode, an intermediate layer, and a second electrode,
the power wiring is formed of a same material as that of the source electrode or the drain electrode,
the circuit wiring is formed of a same material as that of the first electrode, and
the metal layer is formed of a same material as that of the second electrode.

15. The display device as claimed in claim 1, further comprising a pixel defining layer that defines each of the pixels of the display unit, wherein the protrusion portion is formed of a same material as that of the pixel defining layer.

16. The display device as claimed in claim 1, wherein the first sealing portion and the second sealing portion are integrally formed.

17. The display device as claimed in claim 1, further comprising a reinforcing member on an outer side of the first sealing portion.

* * * * *